United States Patent [19]

Skovmand

[11] Patent Number: 4,803,612
[45] Date of Patent: Feb. 7, 1989

[54] CLOCK RIPPLE REDUCTION IN A LINEAR LOW DROPOUT C/DMOS REGULATOR

[75] Inventor: Timothy J. Skovmand, San Jose, Calif.

[73] Assignee: National Semiconductor Corporation, Santa Clara, Calif.

[21] Appl. No.: 203,966

[22] Filed: Jun. 8, 1988

[51] Int. Cl.<sup>4</sup> ............................................. G05F 1/56
[52] U.S. Cl. ................................. 323/284; 363/60; 307/270
[58] Field of Search ............... 323/282, 284, 285, 288; 307/270; 363/59, 60, 61

[56] References Cited

U.S. PATENT DOCUMENTS

| | | | |
|---|---|---|---|
| 4,053,821 | 10/1977 | Hose, Jr. et al. | 363/60 |
| 4,484,092 | 11/1984 | Campbell, Jr. | 307/270 X |
| 4,553,082 | 11/1985 | Nesler | 323/282 X |
| 4,626,697 | 12/1986 | Nelson | 363/60 X |
| 4,737,667 | 4/1988 | Tihanyi | 307/270 X |

Primary Examiner—Patrick R. Salce
Assistant Examiner—Kristine Peckman
Attorney, Agent, or Firm—Gail W. Woodward; Lee Patch; Mark Aaker

[57] ABSTRACT

A pair of voltage triplers are formed in a C/DMOS circuit along with a self-isolated DMOS transistor. The voltage triplers are driven in phase opposition from the system clock and their outputs commonly drive the gate of the DMOS transistor which acts as the pass element in a voltage regulator. A control circuit includes a reference voltage generator and a differential amplifier that senses a fraction of the d-c output voltage. The amplifier has an output coupled to the DMOS gate thereby to create a stabilizing negative feedback loop. The voltage triplers overdrive the DMOS transistor so the dropout voltage is low and the full wave rectifier action will double the clock frequency for easier filtering.

4 Claims, 1 Drawing Sheet

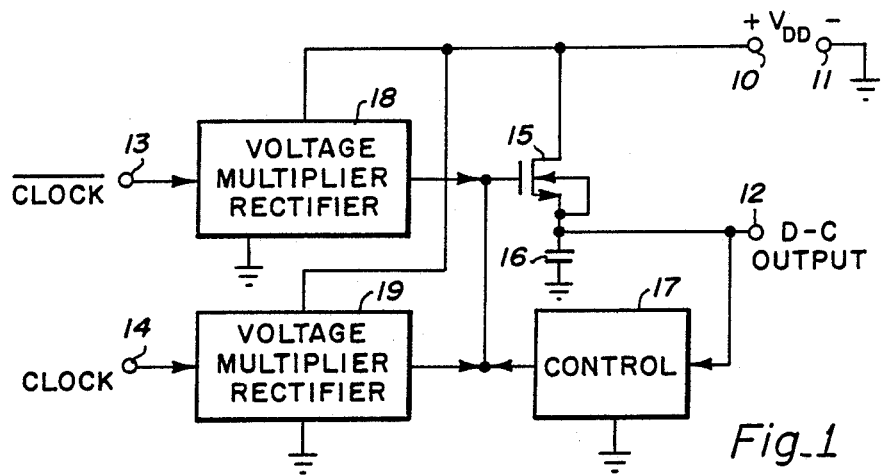
Fig_1
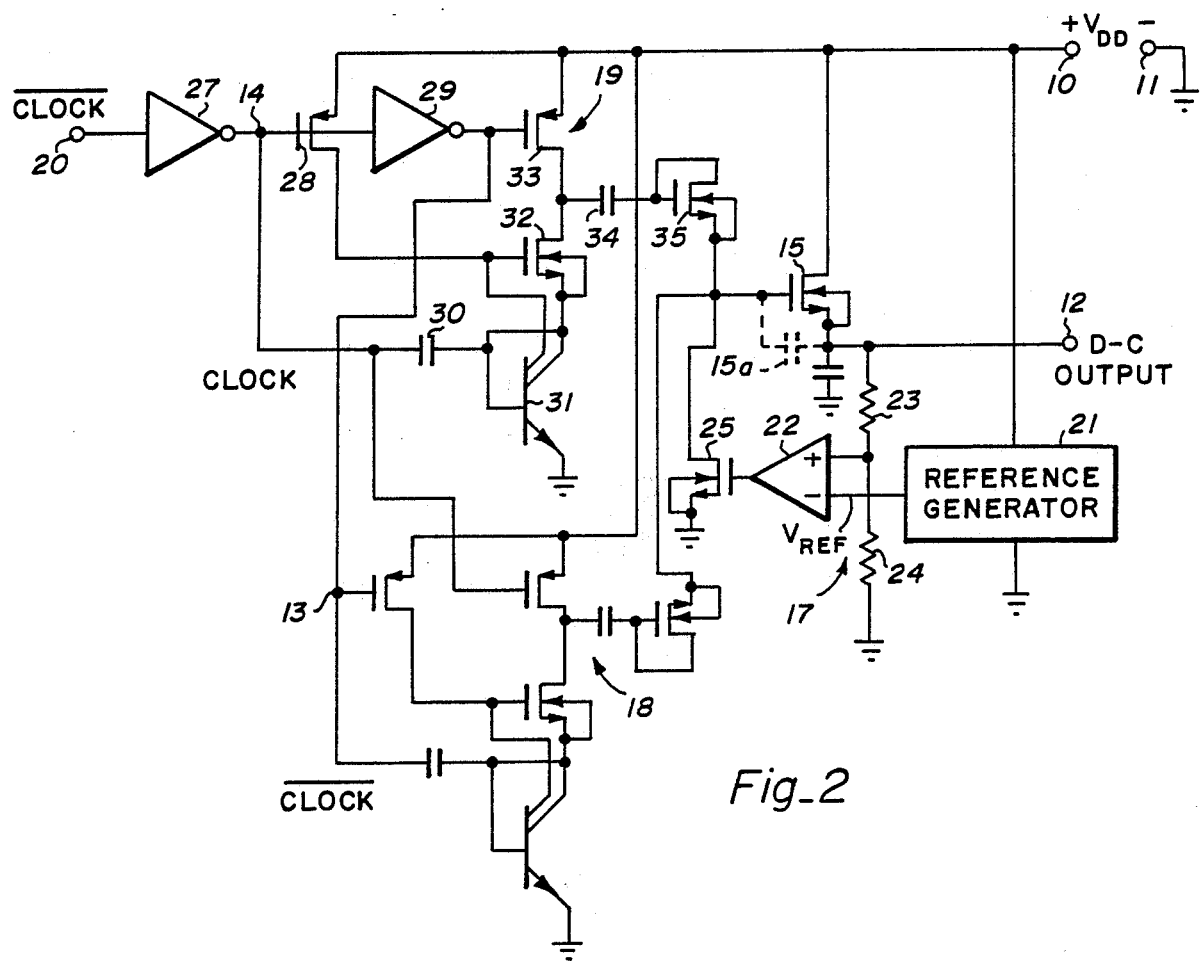
Fig_2

CLOCK RIPPLE REDUCTION IN A LINEAR LOW DROPOUT C/DMOS REGULATOR

BACKGROUND OF THE INVENTION

The invention relates to voltage regulators having low dropout voltage. In particular, linear complementary metal oxide semiconductor (CMOS) technology is used wherein diffused metal oxide semiconductor (DMOS) devices are included. A large area self-isolated DMOS transistor can pass a substantial current that is linearly related to a control potential. This characteristic is disclosed and claimed in my copending patent application Ser. No. 189,442, filed May 2, 1988. This application is titled VOLTAGE MULTIPLIER COMPATIBLE WITH A SELF-ALIGNED C/DMOS PROCESS and is assigned to the assignee of the present invention. Its teaching is incorporated herein by reference.

Basically, I have found that a large area DMOS transistor operated from a relatively low voltage supply can couple a potential that is very close to that of the supply. This means that when the DMOS transistor is employed as a pass transistor in a voltage regulator, the dropout voltage can be very low. To do this the gate of the DMOS transistor must be operated at a potential that is substantially in excess of the supply potential. This is called overdrive. In the above-referenced patent application a DMOS transistor coupled to a 5-volt $V_{DD}$ supply will ordinarily be overdriven at a gate potential of 10 to 15 volts. Such an overdrive can be obtained from a voltage multiplier rectifier that is operated from a system clock pulse which ordinarily has a peak-to-peak value substantially equal to the $V_{DD}$ supply voltage. Thus, for a 5-volt system a voltage tripler will produce a bias level of almost 15 volts.

SUMMARY OF THE INVENTION

It is an object of the invention to reduce the ripple voltage in a linear CMOS voltage regulator using a DMOS pass transistor with gate overdrive.

It is a further object of the invention to reduce the output voltage ripple in the overdrive of the gate of a DMOS transistor using a full wave clock pulse voltage multiplier rectifier to provide the overdrive.

These and other objects are achieved in a CMOS circuit in the following manner. A pair of voltage multiplier rectifiers are operated respectively from the system clock and its complement. The rectifier outputs are combined to bias the gate of a DMOS pass transistor, the output of which provides a regulated d-c voltage. A control circuit is coupled to the DMOS transistor gate so as to vary its potential in response to a circuit which senses the output voltage and compares it to a reference potential. Thus, a negative feedback loop is created around the DMOS transistor and any output ripple is substantially reduced. Furthermore, the full wave rectifier action doubles the clock frequency and therefore the gate supply ripple frequency which makes it easier to filter.

BRIEF DESCRIPTION OF THE DRAWING

FIG. 1 is a block diagram showing the basic elements of the invention.

FIG. 2 is a schematic diagram showing the details of the circuit of the invention.

DESCRIPTION OF THE INVENTION

In FIG. 1 the circuit is shown being operated from a $V_{DD}$ power supply connected + to terminal 10 and − to ground terminal 11. The circuit produces a regulated d-c output at terminal 12. The circuit responds to a $\overline{\text{CLOCK}}$ signal at terminal 13 and its complement at terminal 14. Pass transistor 15 is a large area DMOS transistor which is shown as an N channel device. Ordinarily, this transistor will be formed in a P well that is formed in an N type semiconductor wafer. Thus, transistor 15 is electrically isolated and its back gate, the P well, is connected to its source. A filter capacitor 16 filters the d-c output at the source of transistor 15. A control circuit 17 senses the voltage at terminal 12 and controls the gate potential of transistor 15 to provide the desired output voltage. Voltage multipliers 18 and 19 operate respectively from the $\overline{\text{CLOCK}}$ and its complement at terminals 13 and 14. Thus, the maximum potential available at the gate of transistor 15 will be a multiple of $V_{DD}$ and it will have a ripple frequency of twice the clock frequency. Such a ripple is more readily filtered.

In the schematic diagram of FIG. 2 the elements, as they relate to FIG. 1, carry the same numerals. Control circuit 17 includes a voltage reference 21 of conventional configuration. A temperature insensitive voltage, $V_{REF}$, is applied to the inverting input of diff amp 22. Resistors 23 and 24 form a voltage divider across the regulated d-c output and therefore provide a fraction of the output to the noninverting input of diff amp 22. The output of diff amp 22 drives the gate of N channel transistor 25 which operates as a high gain inverter. This produces negative feedback loop around transistor 15 which will stabilize the output voltage in accordance with the relationship:

$$V_{OUTPUT} = V_{REF}(1 + R23/R24)$$

where R23 and R24 are the value of resistors 23 and 24. The negative feedback loop involves the gain of diff amp 22 and the cascaded gain of inverter transistor 25 so it is a high gain loop. This means that any ripple voltage at terminal 12 will be fed back to the gate of transistor 15 so as to cancel itself. Thus, the control circuit 17 provides essentially a low ripple configuration.

Voltage multiplier 19 is a voltage tripler that operates substantially as set forth in my above-referenced patent application Ser. No. 189,442, filed May 2, 1988. A $\overline{\text{CLOCK}}$ signal at input 20 produces the CLOCK signal at terminal 14 by way of inverter buffer 27. Inverter 29, which is coupled to the gate of transistor 28, creates a $\overline{\text{CLOCK}}$ signal at terminal 13. The CLOCK signal is also applied to one end of capacitor 30. The other end of capacitor 30 couples the same CLOCK signal to the base of transistor 31 and to the source of N channel transistor 32. The output of inverter 29 applies a $\overline{\text{CLOCK}}$ signal to the gate of P channel transistor 33. Transistor 31 has two collectors, one of which is returned to its base and to the source of transistor 32. The other collector is coupled to the gate of transistor 32 and the drain of transistor 28. The drains of N channel transistor 32 and P channel transistor 33 are both coupled to one end of capacitor 34. The other end of capacitor 34 is coupled to the gate and drain of N channel transistor 35. The source and back gate of transistor 35 constitutes the output of voltage multiplier 19, which is coupled to drive the gate of transistor 15. The gate capacitance 15a of transistor 15, which is shown in dashed outline, comprises a capacitance that is charged by the multiplier rectifier action.

When terminal 14 is high, capacitor 30 will couple a positive potential to the base of transistor 31 which will therefore be on. The emitter-base diode of transistor 31 will charge capacitor 30 to a level of one $V_{BE}$ below the peak clock voltage. Under this clock condition transistor 28 will be off and the upper collector of transistor 31 will pull the gate of transistor 32 low so as to turn it off. The output of inverter 29 will drive the gate of transistor 33 low to turn it on. Capacitor 34 will thereby have its left hand end at $+V_{DD}$ and transistor 35 will conduct so as to place an incremental positive charge on the gate capacitance 15a of transistor 15.

On the opposite voltage excursion of the CLOCK signal terminal 14 will be close to ground potential. The charge on capacitor 30 will then drive the base of transistor 31, along with the lower collector to a negative potential of one $V_{BE}$ above $V_{DD}$, which represents the charge on capacitor 30 produced during the previous half CLOCK cycle. The low at terminal 14 will turn transistor 28 on thereby pulling the gate of transistor 32 up so as to turn it on. Under these conditions inverter 29 will turn transistor 33 off. This action will pull the left hand end of capacitor 34 below ground while transistor 35 will clamp the right hand end of capacitor 34 close to the positive potential at the gate of transistor 15. While it may require several clock cycles, capacitor 34 will ultimately charge up to about 2 $V_{DD}$ or double the clock pulse peak. As a result, when transistor 32 is on the potential at the right hand end of capacitor 34 will be close to 3 $V_{DD}$. Transistor 35 will substantially transfer this potential to the gate capacitance 15a of transistor 15. The end result is that a voltage tripler action is present after several CLOCK pulse cycles and the gate of transistor 15 will be at almost three times the peak CLOCK pulse voltage.

Voltage tripler 19 is repeated at 19 which is a second tripler operated out of phase with tripler 19. Note that the output of inverter 29 provide $\overline{CLOCK}$ to terminal 13. Tripler 18 operates identically with tripler 19 (except for the phase difference) and it too acts to charge capacitance 15a. However, due to the out of phase operation the two triplers operate as a full wave rectifier. This means that capacitance 15a is charged at twice the clock frequency. As a result the action of capacitor 16 on the d-c output at terminal 12 will be doubly as effective in removing ripple.

EXAMPLE

The circuit of FIG. 2 was constructed using standard P well CMOS. $V_{REF}$ was 1.2 volts and resistor 24 was made 1.2K ohms. Resistor 23 was made variable. Transistor 15 was a large area DMOS having a channel length of 2 microns and a total channel width of 80 cm. Capacitor 30 was 20 pf and capacitor 34 was 20 pf. Capacitor 16 was made 10 microfarads. Using a 5-volt $V_{DD}$ supply and a 5-volt clock, when resistor 23 was zero, the output at terminal 12 was 1.2 volts. When resistor 23 was increased the output voltage could be raised as high as 4.5 volts. The output current capability was about 5 amperes. The voltage at the gate of transistor 15 could be as high as 13.5 volts. At the maximum output current and maximum voltage the peak-to-peak ripple was about 1 millivolt.

The invention has been described and a working example detailed. When a person skilled in the art reads the foregoing description, alternatives and equivalents, within the spirit and intent if the invention, will be apparent. Accordingly, it is intended that the scope of the invention be limited only by the claims that follow.

I claim:

1. A C/DMOS voltage regulator connectable to a source of operating power and to a source of clock pulses for producing a regulated d-c output, said voltage regulator comprising:
   a DMOS pass transistor having a gate electrode, its drain electrode coupled to said source of operating power and its source electrode providing said regulated d-c output;
   a first voltage multiplier rectifier having an input coupled to receive said source of clock pulses and an output coupled to said gate of said DMOS transistor;
   a second voltage multiplier rectifier having an input coupled to receive the complement of said source of clock pulses and an output coupled to said gate of said DMOS transistor; and
   a control circuit responsive to said d-c output and operative to control the potential of said gate of said DMOS transistor.

2. The voltage regulator of claim 1 wherein said first and second voltage multiplier rectifiers are voltage triplers and are composed of CMOS devices.

3. The voltage regulator of claim 1, including a voltage reference producing circuit and differential amplifier means having an output coupled to said gate of said DMOS transistor, a first input coupled to said reference producing circuit and a second input coupled to receive a fraction of said d-c output.

4. The voltage regulator of claim 3 wherein said differential amplifier means include an inverting CMOS amplifier stage having an output connected to said gate of said DMOS transistor, an input coupled to a differential driver having its inverting input connected to said reference voltage and its non-inverting input connected to a voltage divider that is connected across said d-c output.

* * * * *